United States Patent [19]

Kawamura et al.

[11] Patent Number: 5,153,095
[45] Date of Patent: Oct. 6, 1992

[54] LIGHT-SENSITIVE PHOTOPOLYMERIZABLE COMPOSITION CONTAINING POLYMER WITH ETHYLENIC UNSATURATION IN THE SIDE CHAIN

[75] Inventors: Kouichi Kawamura; Hiromichi Sano; Masanori Imai, all of Shizuoka, Japan

[73] Assignee: Fuji Photo Film Co., Ltd., Minami-Ashigara, Japan

[21] Appl. No.: 729,898

[22] Filed: Jul. 15, 1991

Related U.S. Application Data

[63] Continuation of Ser. No. 409,675, Sep. 20, 1989, abandoned.

[30] Foreign Application Priority Data

Sep. 21, 1988 [JP] Japan .................. 63-237292

[51] Int. Cl.⁵ .................. G03F 7/021; G03F 7/027; G03F 7/032
[52] U.S. Cl. .................. 430/175; 430/157; 430/176; 430/270; 430/281; 430/284; 430/286; 430/287; 430/906; 430/910
[58] Field of Search .................. 430/175, 282, 284, 287, 430/906, 910, 176, 270, 281, 286

[56] References Cited

U.S. PATENT DOCUMENTS

| | | | |
|---|---|---|---|
| 3,458,311 | 7/1969 | Alles . | |
| 4,511,645 | 4/1985 | Koike et al. | 430/276 |
| 4,687,727 | 8/1987 | Toyama et al. | 430/175 |

FOREIGN PATENT DOCUMENTS

| | | | |
|---|---|---|---|
| 2229302 | 1/1973 | Fed. Rep. of Germany | 430/282 |
| 0158722 | 2/1983 | German Democratic Rep. | 430/287 |
| 4014630 | 4/1974 | Japan | 430/287 |
| 3259657 | 10/1988 | Japan | 430/175 |
| 1392076 | 4/1975 | United Kingdom . | |
| 2086926 | 5/1982 | United Kingdom | 430/284 |

*Primary Examiner*—Charles L. Bowers, Jr.
*Assistant Examiner*—Christopher G. Young
*Attorney, Agent, or Firm*—Burns, Doane, Swecker & Mathis

[57] ABSTRACT

A light-sensitive composition comprises (A) a polymer comprising structural units represented by the following general formula (I):

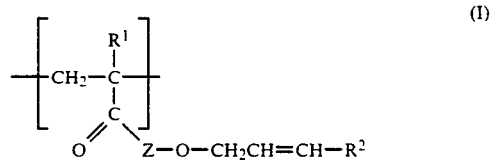

(wherein $R^1$ represents a hydrogen atom or a methyl group; $R^2$ represents a hydrogen atom, an alkyl group or an aryl group; and Z represents a bivalent connecting group having at least 3 non-metallic atoms in the main chain); (B) a monomer or an oligomer having at least two polymerizable ethylenically unsaturatred double bonds; and (C) a photopolymerization initiator. The light-sensitive composition has high sensitivity and is excellent in stability of sensitivities such as storage stability, temperature dependency and latent image sensitization.

21 Claims, No Drawings

LIGHT-SENSITIVE PHOTOPOLYMERIZABLE COMPOSITION CONTAINING POLYMER WITH ETHYLENIC UNSATURATION IN THE SIDE CHAIN

This application is a continuation of application Ser. No. 07/409,675, filed Sep. 20, 1989 now abandoned.

BACKGROUND OF THE INVENTION

The present invention relates to a light-sensitive composition and more specifically to a new photopolymerizable light-sensitive composition having high sensitivity and stability.

There has conventionally been tried to use a variety of reactive binders for the purpose of enhancing the sensitivity of light-sensitive compositions. For instance, many reactive binders whose side chains carry (meth)acrylate groups have been proposed. Examples thereof are disclosed in, for instance, Japanese Patent Publication for Opposition Purpose (hereinafter referred to as "J. P. KOKOKU") Nos. Sho 39-19898, Sho 51-37316 and Sho 49-17874 and U.S. Pat. No. 3,556,793.

These binders ensure such enhancement in the sensitivity of light-sensitive compositions, but they suffer from a problem of low storage stability. This makes it difficult to practically use them.

On the other hand, if a light-sensitive composition comprising a binder, a monomer and a photopolymerization initiator as disclosed in J. P. KOKOKU No. Sho 46-32714 is used for preparing a presensitized plate for use in making a lithographic printing plate (hereunder referred to as "PS plate"), it is found that the sensitivity of the PS plate is greatly influenced by the surface temperature thereof during imagewise exposure to light (hereunder this phenomenon is referred to as "temperature dependency"). Moreover, it is also found that the photopolymerizable composition undergoes post-polymerization after completion of imagewise exposure due to residual active species and its sensitivity increases as the time elapsed from the end of the imagewise exposure till the initiation of its development increases (hereunder this phenomenon is referred to as "latent image sensitization").

To solve the problems of the aforementioned storage stability, temperature dependency and latent image sensitization, Japanese Patent Unexamined Publication (hereunder referred to as "J. P. KOKAI") No. Sho 59-46643 (U.S. Pat. No. 4,511,645) proposes the use of binders each having an allyl group. These binders makes it possible to eliminate the foregoing problems and to impart high sensitivity to light-sensitive compositions and thus they have been practically used. However, there is a need for further enhancement of the sensitivity of light-sensitive compositions.

SUMMARY OF THE INVENTION

Accordingly, an object of the present invention is to provide a light-sensitive composition which has high sensitivity and is improved in properties such as storage stability, temperature dependency and latent image sensitization.

The aforementioned and other objects of the present invention can effectively be achieved by providing a light-sensitive composition which comprises (A) a polymer comprising structural units represented by the following general formula (I):

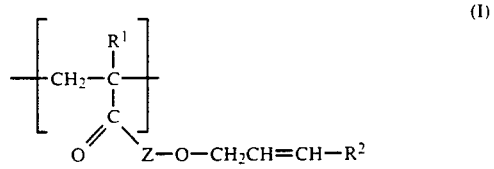

(wherein $R^1$ represents a hydrogen atom or a methyl group; $R^2$ represents a hydrogen atom, an alkyl group or an aryl group; and Z represents a bivalent linking group having at least 3 non-metallic atoms in the main chain);

(B) a monomer or an oligomer having at least two polymerizable ethylenically unsaturated double bonds; and (C) a photopolymerization initiator.

DETAILED EXPLANATION OF THE INVENTION

The present invention will hereunder be explained in more detail. Each component of the light-sensitive composition of the present invention will first be detailed below.

In the foregoing general formula (I), $R^2$ more specifically represents a hydrogen atom, an alkyl group having up to 7 carbon atoms such as a methyl or an ethyl; or an aryl group having up to 10 carbon atoms such as a phenyl or naphthyl group. Moreover, these alkyl and aryl groups may have substituents. Examples of such substituents are halogen atoms, alkoxy groups, acyl groups, carboalkoxy groups, alkyl groups and/or aryl groups.

Preferably Z is a bivalent group represented by formula:

$$-X-L-$$

wherein X is —O— or —NH—, and L is an alkylene, arylene or aralkylene group, which may contain in the main chain thereof at least one group selected from the group consisting of —CO—, —O—CO—, —O—, —S—, —NHCO—, —NHCONH—, —O—CO—NH— and —NH—.

Specific examples include

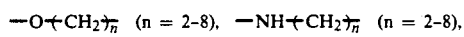

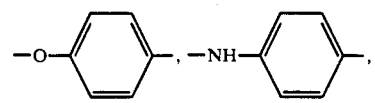

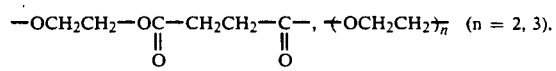

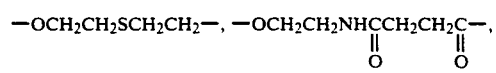

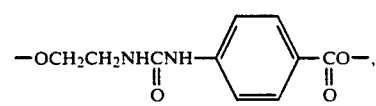

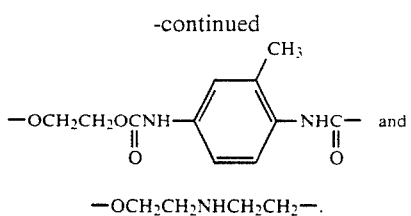 and

—OCH₂CH₂NHCH₂CH₂—.

Specific examples of the polymers having structural units represented by the general formula (I) are as follows:

1. 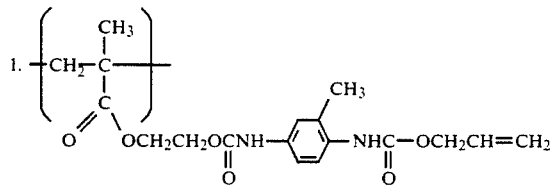

2. 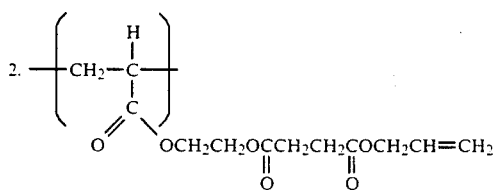

3. 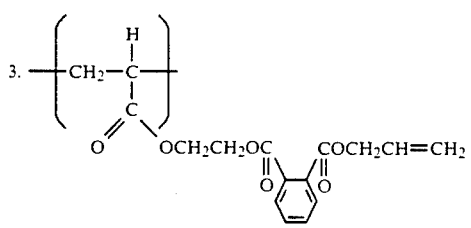

4. 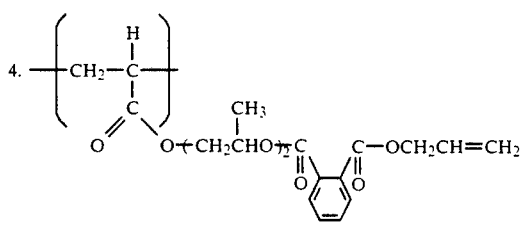

5. 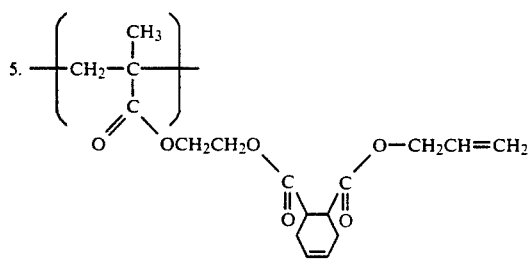

6. 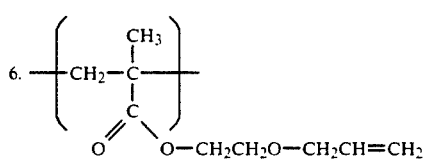

7. 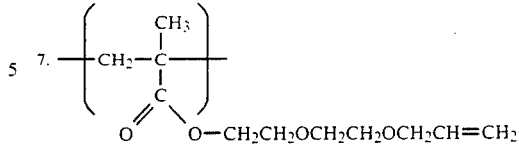

8. 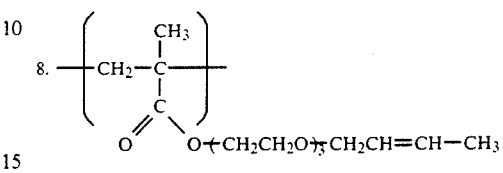

The unsaturated monomers used in the photopolymerizable light-sensitive composition as component (B) are preferably compounds having at least two addition polymerizable unsaturated groups, particularly ethylene glycol (meth)acrylate, polyethylene glycol di(meth)acrylate, trimethylolethane tri(meth)acrylate, trimethylolpropane tri(meth)acrylate, neopentyl glycol di(meth)acrylate, tri-, tetra- and hexa(meth)acrylate of pentaerythritol and dipentaerythritol, epoxy di(meth)acrylate, oligoacrylates as disclosed in J. P. KOKOKU No. Sho 52-7361, and acrylurethane resins or oligomers of acrylurethane as disclosed in J. P. KOKOKU No. Sho 48-41708.

The weight ratio of these monomers or oligomers to the polymer (A) to be incorporated into the composition ranges from 1:9 to 7:3, preferably 2.5:7.5 to 5:5.

The photopolymerization initiators used as component (C) include, for instance, vicinal polyketaldonyl compounds as disclosed in U.S. Pat. No. 2,367,660; α-carbonyl compounds as disclosed in U.S. Pat. Nos. 2,367,661 and 2,367,670; acyloin ethers as disclosed in U.S. Pat. No. 2,448,828; aromatic acyloin compounds which are substituted with hydrocarbons at the α-position as disclosed in U.S. Pat. No. 2,722,512; polynuclear quinone compounds as disclosed in U.S. Pat. Nos. 3,046,127 and 2,951,758; combinations of triarylimidazole dimers/p-aminophenyl ketones as disclosed in U.S. Pat. No. 3,549,367; benzothiazole compounds as disclosed in U.S. Pat. No. 3,870,524; combinations of benzothiazole compounds/trihalo methyl-s-triazine compounds as disclosed in U.S. Pat. No. 4,239,850; triazine compounds as disclosed in German Patent No. 3,726,001A; acridine and phenazine compounds as disclosed in U.S. Pat. No. 3,751,259; and oxadiazole compounds as disclosed in U.S. Pat. No. 4,212,970. The amount thereof used ranges from about 0.5 to about 15% by weight, preferably 2 to 10% by weight on the basis of the total weight of the photopolymerizable light-sensitive composition.

The light-sensitive composition may be used to form, for instance, paints and dental material wherein the composition serves as a photohardenable material and relief-forming material, resists and PS plates wherein the composition serves as an image-forming material.

When the light-sensitive composition of the invention is used for preparing PS plates, the polymer component in the composition preferably comprises carboxylic acid components such as acrylic acid and/or methacrylic acid components in addition to the structural units represented by the general formula (I) to make the composition developable with an alkaline developer such as an aqueous alkaline solution. In this case, the light-sensitive composition of the present invention desirably comprises, in addition to the aforesaid components (A), (B) and (C), a heat polymerization inhibitor for preventing undesired heat polymerization of the polymerizable compounds having ethylenically unsaturated bonds during preparation and/or storage of the composition. Examples of preferred heat polymerization inhibitors are hydroquinone, p-methoxyphenol, di-t-butyl-p-cresol, pyrogallol, t-butyl catechol, benzoquinone, copper(I) chloride, phenothiazine, chloranil, naphthylamine, $\beta$-naphthol, nitrobenzene and dinitrobenzene.

In addition, the light-sensitive composition may optionally comprise dyes or pigments such as Methylene Blue, Crystal Violet, Rhodamine B, Fuchsine, Auramine, azo dyes, anthraquinone dyes, titanium oxide, carbon black, iron oxide, phthalocyanine pigments and azo pigments, for coloring the resulting light-sensitive layer.

A negative working diazo resin such as $PF_6$ salt of a condensate of p-diazodiphenylamine with formaldehyde may be added to the light-sensitive composition to improve the adhesion between the light-sensitive layer and an aluminum substrate which is anodized (sulfuric acid or phosphoric acid is used as an electrolyte) and then treated with a silicate.

The photopolymerizable composition of the invention may further comprise, if necessary, a plasticizer. Examples thereof are phthalates such as dimethyl phthalate, diethyl phthalate, dibutyl phthalate, dihexyl phthalate, dicyclohexyl phthalate and ditridecyl phthalate; glycol esters such as dimethyl glycol phthalate, ethyl phthalylethyl glycolate and butyl phthalylbutyl glycolate; phosphoric acid esters such as tricresyl phosphate and triphenyl phosphate; and aliphatic dibasic acid esters such as diisobutyl adipate, dioctyl adipate, dibutyl sebacate and dibutyl maleate.

The photopolymerizable composition of the present invention is used in such a manner that the foregoing various components are dissolved in a solvent and then applied onto a suitable substrate in a known manner.

The preferred amount (part by weight) of these components per 100 parts by weight of the polymerizable compound (B) having ethylenically unsaturated bonds are as follows:

|  | Preferred Range | Most Preferred Range |
| --- | --- | --- |
| Heat Polymerization Inhibitor | 0 ~ 10 | 0 ~ 5 |
| Dye or Pigment | 0 ~ 50 | 0 ~ 20 |
| Plasticizer | 0 ~ 200 | 0 ~ 50 |

Examples of the solvents used when the composition of the invention is applied onto a substrate are ethylene dichloride, cyclohexanone, methyl ethyl ketone, methyl cellosolve acetate, methyl cellosolve, propylene glycol monomethyl ether, propylene glycol monomethyl ether acetate, methanol, monochlorobenzene, toluene and ethyl acetate. These solvents may be used alone or in combination.

The light-sensitive composition of the invention is favorable as a material for obtaining light-sensitive layer of a PS plate. When a PS plate is prepared from the composition, the amount thereof coated preferably ranges from 0.1 to 10.0 $g/m^2$, particularly 0.5 to 5.0 $g/m^2$ expressed in the solid contents thereof. Examples of substrates suitable for producing PS plates are a hydrophilized aluminum plate such as an aluminum plate treated with a silicate, an anodized aluminum plate, a grained aluminum plate, a silicate electrodeposited aluminum plate as well as a zinc plate, a stainless steel plate, a copper plate treated with a chromate and a hydrophilized plastic film or paper.

Alternatively, if the composition of the invention is used to prepare proofing plates for printing, films for overhead projector and films for intermediate print, examples of substrates suitable for these products are transparent films such as polyethylene terephthalate and cellulose triacetate films and these plastic films whose surface is matted chemically or physically.

If the light-sensitive composition of the present invention is used for preparing films for photomask, examples of preferred substrate are aluminum plates, polyethylene terephthalate films to which an aluminum alloy or chromium layer is deposited or polyethylene terephthalate films to which a colored layer is applied.

If the composition of the present invention is used as a photoresist material, various substrates such as a copper plate, plates on which a copper layer is deposited, a stainless steel plate or a glass plate can be used.

A protective layer comprising, for instance, a polymer excellent in oxygen barrier properties such as polyvinyl alcohol and acidic celluloses can be applied onto the surface of a layer of the photopolymerizable composition to completely prevent the polymerization inhibiting effect of oxygen in the air. Methods for applying such a protective layer are detailed in, for instance, U.S. Pat. No. 3,458,311 and J.P. KOKOKU No. Sho 55-49729.

Moreover, to eliminate the influence of oxygen during imagewise exposure to light, the light-sensitive composition of the present invention may comprise higher aliphatic acids or higher aliphatic acid amides such as behenic acid or behenic acid amide as disclosed in J.P. KOKAI Nos. Sho 61-282836 and Sho 62-11851.

Further, a matting agent may be added to the light-sensitive layer to improve the adhesive properties thereof in a vacuum during exposure to light to thus reduce the amount of oxygen present on the surface of the light-sensitive layer.

The light-sensitive composition of the present invention has high sensitivity and is improved in stability of sensitivities such as storage stability, temperature dependency and latent image sensitization.

The present invention will hereunder be explained in more detail with reference to the following non-limitative working Examples and Preparation Examples. Further, the effects practically achieved will also be discussed in detail in comparison with Comparative Examples.

In the following Examples and Comparative Examples, the term "%" means "% by weight" unless otherwise specified.

PREPARATION EXAMPLE

Preparation of a Polymer Having the Following Structural Formula, Used in the Light-sensitive Composition of the Invention

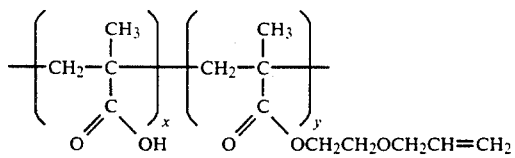

188.19 g of 1-methoxy-2-propanol as a reaction solvent and 0.91 g of methacrylic acid and 20.0 g of 2-allyloxyethanol ester of methacrylic acid as polymerizable monomers were introduced into a 500 ml 3-necked flask equipped with a stirring rod, stirring blades, a refluxing condenser and a thermometer and heated to 75° C. with replacing the atmosphere with nitrogen gas.

To the reaction solution, there was added 0.32 g of 2,2'-azobis(2,4-dimethylvaleronitrile) and the stirring was continued at that temperature for 7 hours. After completing the reaction, the reaction solution was poured into 5 l of water to precipitate the resultant polymer. The polymer was filtered off and dried to thus obtain 12.70 g of a solid material (yield=61%).

It was confirmed, from the determination of acid value of the resulting polymer, that it was a copolymer comprising 10% of methacrylic acid and 90% of 2-allyloxyethanol ester of methacrylic acid (molar ratio).

The weight averaged molecular weight of the polymer was found to be 52,000 by a GPC measurement.

EXAMPLE 1

The surface of an aluminum plate having a thickness of 0.24 mm was grained using a nylon brush and an aqueous suspension of 400 mesh pumice stone and washed with water sufficiently. Then, the aluminum plate surface was etched by immersing the plate in 10% aqueous sodium hydroxide solution at 70° C. for 60 seconds, washed with running water, neutralized and washed with 20% $HNO_3$ solution and then washed with water. The aluminum plate thus treated was subjected to an electrolytic surface roughening treatment at a quantity of electricity of 160 coulomb/dm² in 1% nitric acid aqueous solution, under conditions: 12.7 V of anodic voltage and the ratio of the quantity at the cathode time electricity to that at the anode time electricity of 0.8, utilizing an alternating waved current of sinusoidal wave. The centerline surface roughness (Ra) was determined at this stage and found to be 0.6μ. Subsequently, the plate was immersed in 30% sulfuric acid solution maintained at 55° C. for 2 minutes to desmut it, then anodized at a current density of 2 A/dm² for 2 minutes in 20% sulfuric acid solution so that the thickness of an oxidized layer formed was 2.7 g/m². Thereafter, it was immersed in 2.5% aqueous solution of sodium silicate maintained at 70° C. for one minute, washed with water and dried. The following solution (1) of a light-sensitive composition (hereunder referred to as "light-sensitive solution") was applied onto the surface of the aluminum substrate thus prepared.

| Light-sensitive Solution (1) | |
|---|---|
| Component | Amount (g) |
| Pentaerythritol tetraacrylate | 1.5 |
| Polymer binder prepared in Preparation Example and represented by the following formula: | 3.5 |

$$\left(\begin{array}{c} CH_3 \\ -CH_2-C- \\ | \\ COOH \end{array}\right)_{10} \left(\begin{array}{c} CH_3 \\ -CH_2-C- \\ | \\ COOCH_2CH_2OCH_2CH=CH_2 \end{array}\right)_{30}$$

| | |
|---|---|
| 2,4-Trichloromethyl-(4'-methoxynaphthyl)-s-triazine | 0.2 |
| Oil-soluble blue dye (C.I. 42596) | 0.07 |
| Propylene glycol monomethyl ether | 30 |
| Methyl ethyl ketone | 30 |
| F-177 (a fluorine atom-containing surfactant available from DAINIPPON INK AND CHEMICALS, INC.) | 0.3 |

The light-sensitive solution (1) was applied onto the substrate with a whirler so that the amount coated was 2.0 g/m² (weighed after drying). The drying thereof was performed at 80° C. for 2 minutes. Then, an aqueous solution of polyvinyl alcohol (viscosity measured by Hopler viscometer on 4% solution at 20° C., 5.3±0.5(cp); degree of saponification, 86.5~89.0 mole %; degree of polymerization, not more than 1,000) was applied thereto so that the amount coated was 1.0 g/m² (weighed after drying). The drying thereof was performed at 100° C. for 2 minutes. The plate thus prepared was hereunder referred to as "Sample A".

COMPARATIVE EXAMPLE 1

A light-sensitive solution was prepared from the same components as those of the light-sensitive solution (1) except that a polymer binder represented by the following formula was substituted for the polymer binder used in the light-sensitive solution (1).

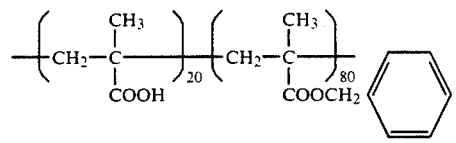

In the same manner as in Example 1, a light-sensitive layer and a layer of polyvinyl alcohol were applied onto a substrate similar to that used in Example 1. The plate thus obtained was hereunder referred to as "Sample B".

COMPARATIVE EXAMPLE 2

A light-sensitive solution was prepared from the same components as those of the light-sensitive solution (1) except that a polymer binder represented by the following formula was substituted for the polymer binder used in the light-sensitive solution (1).

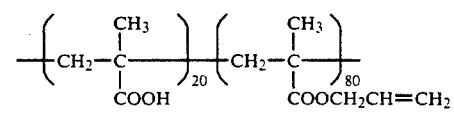

The same procedures as in Example 1 were repeated to obtain a light-sensitive plate which was hereunder referred to as "Sample C".

COMPARATIVE EXAMPLE 3

The same procedures as in Example 1 were repeated to form a light-sensitive plate, which was hereunder referred to as "Sample D", except that the following binder which was similar to that used in Comparative Example 2 and had a methacrylic acid content smaller than that of the latter.

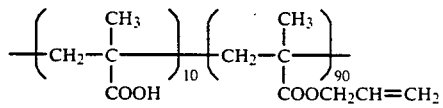

To determine the sensitivity of these Samples A to D, a PS Step Guide (gray scale whose transmission density is stepwise changed by $\Delta D = 0.15$; available from Fuji Photo Film Co., Ltd.) was superposed on each Sample, the assemblies were exposed to light using a printer (manufactured by BERKEY TECHNICAL INC. U. S. A.) (light source: a 2 kW metal halide lamp), Samples were immersed in a developer having the following composition at room temperature for 50 seconds and the surface thereof was rubbed with absorbent wadding lightly to remove un-exposed areas.

| Developer | |
|---|---|
| Component | Amount (g) |
| Sodium sulfite | 5 |
| Benzyl alcohol | 30 |
| Sodium carbonate | 5 |
| Sodium isopropylnaphthalene sulfonate | 10 |
| Pure water | 1000 |

The step number of the step guide on the developed plate was determined and the results obtained were listed in the following Table. In addition, the time required for completely dissolving and removing the un-exposed areas with the developer was determined to evaluate the developability of the plates during development. The results are summarized in the following Table.

| | Step Number of Step Guide | Developability |
|---|---|---|
| Sample A | 14 | within 10 sec. |
| Sample B | 7 | " |
| Sample C | 10 | " |
| Sample D | 12 | 30 sec. |

Sample A was superior in sensitivity to the other Samples and was also excellent in the developability, i.e. the solubility of the un-exposed areas in the developer.

EXAMPLE 2

A light-sensitive solution (2) having the following composition was prepared.

| Component | Amount (g) |
|---|---|
| Pentaerythritol hexaacrylate | 2.0 |
| Polymer binder represented by the following formula: | 3.0 |

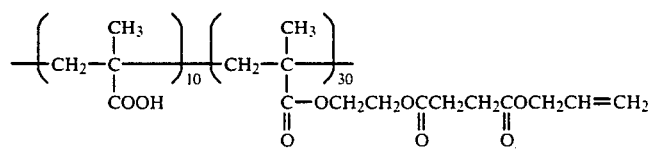

| | |
|---|---|
| 9-Phenyl acridine | 0.3 |
| Copper phthalocyanine pigment | 0.8 |
| Behenic acid | 0.3 |
| Methyl ethyl ketone | 30 |
| Propylene glycol monomethyl ether | 30 |
| F-177 (a fluorine atom-containing surfactant available from DAINIPPON INK AND CHEMICALS, INC.) | 0.3 |

The light-sensitive solution was applied onto the surface of the substrate prepared in the foregoing Example with a whirler so that the coated amount thereof was 2.0 g/m$^2$ (weighed after drying). The drying thereof was performed at 80° C. for 2 minutes. The plate thus prepared was hereunder referred to as "Sample E".

A comparative light-sensitive solution was prepared as in the same manner as above except that the following polymer binder was substituted for the polymer binder used in the light-sensitive solution (2). The same procedures as in Example 2 were repeated to prepare a light-sensitive plate which was hereunder referred to as "Sample F".

Polymer Binder Used

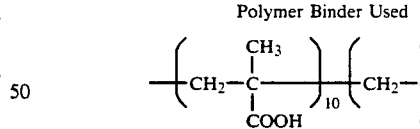

These Samples were exposed to light and developed as in Example 1 and the same measurements were performed on these Samples. The results obtained are listed in the following Table.

| | Step Number of Step Guide | Developability |
|---|---|---|
| Sample E | 13 | within 10 sec. |
| Sample F | 4 | " |
| Example 3 | | |

To compare the temperature dependency of Samples prepared in Examples 1 and 2, a PS Step Guide (available from Fuji Photo Film Co., Ltd.) was superposed on each Sample and the assemblies were exposed to light using the printer (available from BERKEY TECHNI- CAL INC. U. S. A) (light source: a 2 kW metal halide lamp). In this respect, the exposure was performed by adjusting the temperature of a printing frame of the printer to 10° and 50° C. and immediately thereafter the Samples were developed with the developer described above.

The step number of the step guide observed after development was examined and the results obtained were summarized in the following Table.

Then, for comparing the latent image sensitization of these Samples, the exposure was carried out while the temperature of the printing frame of the printer was maintained at 15° C. and the development was performed immediately after exposure to light or one hour after the exposure. The number of steps of the step guide was determined in both cases and the results observed were listed in the following Table.

|  | Difference between the step numbers observed at 10° C. and 50° C. (exposure Temp.) | Latent Image Sensitization (0 to 1 hour) |
| --- | --- | --- |
| Sample A (Invention) | 1 step | within 0.5 step |
| Sample B (Comparison) | 3 steps | 1.0 step |
| Sample C (Comparison) | 1 step | within 0.5 step |
| Sample D (Comparison) | 1 step | " |
| Sample E (Invention) | 1 step | " |
| Sample F (Comparison) | 3 steps | 1.0 step |

As seen from the results listed in the foregoing Tables, the photopolymerizable composition of the present invention is by no means inferior in both temperature dependency and latent image sensitization to the comparative ones.

What is claimed is:

1. A light sensitive composition comprising:
(A) A polymer comprising structural units represented by general formula (I):

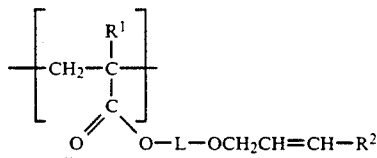

wherein $R^1$ represents a hydrogen atom or methyl group; $R^2$ represents a hydrogen atom, an alkyl group or an aryl group; and L represents an alkylene group having at least two carbon atoms, an arylene group or an aralkylene group, which may contain in the main chain thereof at least one group selected from the group consisting of —CO—, —O—CO—, —O—, —S—, —NHCO—, —NH-CONH—, —OCONH— and —NH—;

(B) a monomer or an oligomer having at least two polymerizable ethylenically unsaturated double bonds; and (C) a photopolymerization initiator.

2. The light-sensitive composition of claim 1 wherein in the foregoing general formula (I), $R^2$ represents a hydrogen atom, an alkyl group having up to 7 carbon atoms; or an aryl group having up to 10 carbon atoms, provided that the alkyl and aryl groups may have substituents selected from the group consisting of halogen atoms, alkoxy groups, acyl groups, carboalkoxy groups, alkyl groups and/or aryl groups.

3. The light-sensitive composition of claim 1 wherein the unsaturated monomer as the component (B) is selected from the group consisting of ethylene glycol (meth)acrylate, polyethylene glycol di(meth)acrylate, trimethylolethane tri(meth)acrylate, trimethylolpropane tri(meth)acrylate, neopentyl glycol di(meth) acrylate, tri-, tetra- and hexa(meth)acrylate of pentaerythritol and dipentaerythritol, epoxy di(meth)acrylate, oligoacrylates, and acrylurethane resins or oligomers of acrylurethane.

4. The light-sensitive composition of claim 1 wherein the weight ratio of the component (B) to the polymer (A) to be incorporated into the composition ranges from 1:9 to 7:3.

5. The light-sensitive composition of claim 4 wherein the weight ratio of the component (B) to the polymer (A) to be incorporated into the composition ranges from 2.5:7.5 to 5:5.

6. The light-sensitive composition of claim 1 wherein the photopolymerization initiator as a component (C) is selected from vicinal polyketaldonyl compounds; α-carbonyl compounds; acyloin ethers; aromatic acyloin compounds which are substituted with hydrocarbons at the α- position; polynuclear quinone compounds; combinations of triarylimidazole dimers/p-aminophenyl ketones; benzothiazole compounds; combinations of benzothiazole compounds/trihalomethyl-s-triazine compounds; triazine compounds; acridine and phenazine compounds; and oxadiazole compounds.

7. The light-sensitive composition of claim 1 wherein the amount of the component (C) ranges from about 0.5 to about 15% by weight on the basis of the total weight of the light-sensitive composition.

8. The light-sensitive composition of claim 7 wherein the amount of the component (C) ranges from 2 to 10% by weight on the basis of the total weight of the light-sensitive composition.

9. The light-sensitive composition of claim 1 wherein it is used for preparing presensitized plates for use in making lithographic printing plates and the polymer component in the composition comprises carboxylic acid components in addition to the structural units represented by the general formula (I).

10. The light-sensitive composition of claim 9 wherein the carboxylic acid component is acrylic acid and/or methacrylic acid components.

11. The light-sensitive composition of claim 9 wherein it further comprises, in addition to the aforesaid components (A), (B) and (C), a heat polymerization inhibitor.

12. The light-sensitive composition of claim 11 wherein the heat polymerization inhibitor is a member selected from the group consisting of hydroquinone, p-methoxyphenol, di-t-butyl-p-cresol, pyrogallol, t-butyl catechol, benzoquinone, copper(I) chloride, phenothiazine, chloranil, naphthylamine, β-naphthol, nitrobenzene and dinitrobenzene.

13. The light-sensitive composition of claim 9 wherein it further comprises dyes or pigments.

14. The light-sensitive composition of claim 13 wherein the dyes or pigments are selected from Methylene Blue, Crystal Violet, Rhodamine B, Fuchsine, Auramine, azo dyes, anthraquinone dyes, titanium oxide, carbon black, iron oxide, phthalocyanine pigments and azo pigments.

15. The light-sensitive composition of claim 9 wherein it comprises a negative working diazo resin.

16. The light-sensitive composition of claim 15 wherein the negative working diazo resin is PF$_6$ salt of a condensate of p-diazodiphenylamine with formaldehyde.

17. The light-sensitive composition of claim 9 wherein it comprises 0 to 10 parts by weight of a heat polymerization inhibitor; 0 to 50 parts by weight of a dye or a pigment; and 0 to 200 parts by weight of a plasticizer per 100 parts by weight of the component (B).

18. The light-sensitive composition of claim 17 wherein it comprises 0 to 5 parts by weight of a heat polymerization inhibitor; 0 to 20 parts by weight of a dye or a pigment; and 0 to 50 parts by weight of a plasticizer per 100 parts by weight of the component (B).

19. The light-sensitive composition of claim 17 wherein the plasticizer is selected from dimethyl phthalate, diethyl phthalate, dibutyl phthalate, dihexyl phthalate, dicyclohexyl phthalate, ditridecyl phthalate, dimethyl glycol phthalate, ethyl phthalylethyl glycolate, butyl phthalylbutyl glycolate, tricresyl phosphate, triphenyl phosphate and diisobutyl adipate, dioctyl adipate, dibutyl sebacate and dibutyl maleate.

20. A light-sensitive composition according to claim 1, wherein the —O—L— group in general formula (I) is —O—(CH$_2$)$_n$ where n=2 to 8,

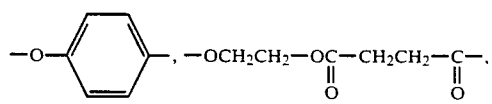

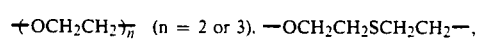

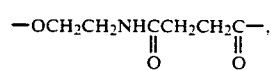

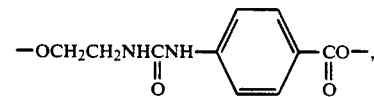

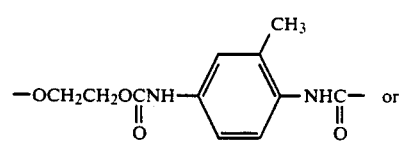

21. A light-sensitive composition according to claim 1, wherein the structural unit represented by general formula (I) is:

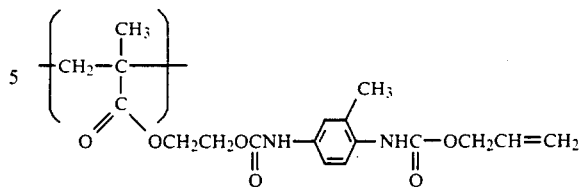

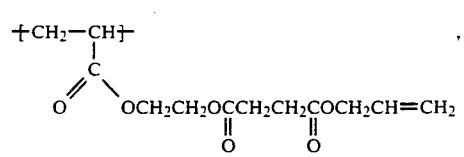

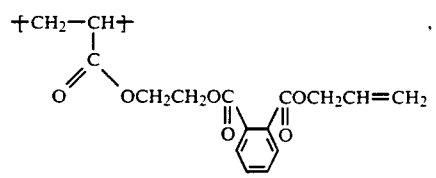

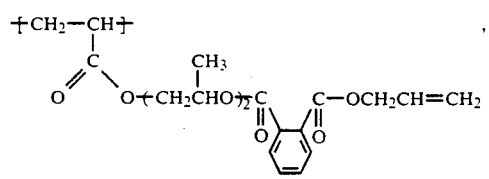

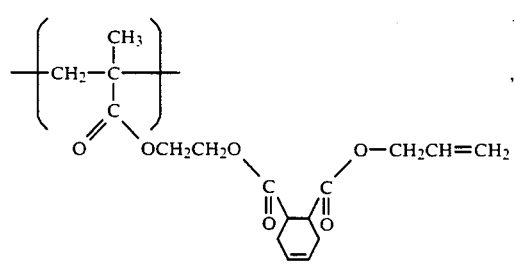

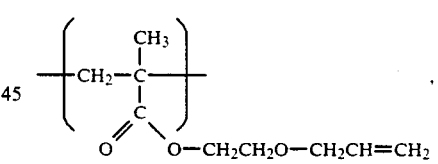

or

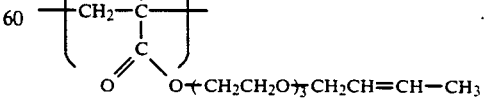

* * * * *